United States Patent
Hu

(10) Patent No.: US 6,316,354 B1
(45) Date of Patent: Nov. 13, 2001

(54) PROCESS FOR REMOVING RESIST MASK OF INTEGRATED CIRCUIT STRUCTURE WHICH MITIGATES DAMAGE TO UNDERLYING LOW DIELECTRIC CONSTANT SILICON OXIDE DIELECTRIC LAYER

(75) Inventor: John Rongxiang Hu, Sunnyvale, CA (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/428,344

(22) Filed: Oct. 26, 1999

(51) Int. Cl.$^7$ .................................................... H01L 21/44

(52) U.S. Cl. ............................ 438/652; 438/624; 438/634

(58) Field of Search ..................................... 438/652, 634, 438/637, 624, 514, 781

(56) References Cited

U.S. PATENT DOCUMENTS

| | | | |
|---|---|---|---|
| 3,012,861 | 12/1961 | Ling | 23/223.5 |
| 3,178,392 | 4/1965 | Kriner | 260/46.5 |
| 3,652,331 | 3/1972 | Yamazaki | 117/201 |
| 3,832,202 | 8/1974 | Ritchie | 106/287 |
| 3,920,865 | 11/1975 | Läufer et al. | 427/220 |
| 4,705,725 | 11/1987 | Glajch et al. | 428/405 |
| 4,771,328 | 9/1988 | Malaviya et al. | 357/49 |
| 5,194,333 | 3/1993 | Ohnaka et al. | 428/405 |
| 5,364,800 | 11/1994 | Joyner | 437/28 |
| 5,376,595 | 12/1994 | Zupancic et al. | 501/12 |
| 5,470,801 | 11/1995 | Kapoor et al. | 437/238 |
| 5,558,718 | 9/1996 | Leung | 118/723 E |
| 5,559,367 | 9/1996 | Cohen et al. | 257/77 |
| 5,580,429 | 12/1996 | Chan et al. | 204/192.38 |
| 5,628,871 | * 5/1997 | Shinagawa . | |
| 5,660,682 | 8/1997 | Zhao et al. | 438/715 |
| 5,675,187 | 10/1997 | Numata et al. | 257/758 |
| 5,688,724 | 11/1997 | Yoon et al. | 437/235 |
| 5,858,879 | 1/1999 | Chao et al. | 438/725 |
| 5,864,172 | 1/1999 | Kapoor et al. | 257/634 |
| 5,874,367 | 2/1999 | Dobson | 438/787 |
| 5,874,745 | 2/1999 | Kuo | 257/59 |
| 5,882,489 | 3/1999 | Bersin et al. | 204/192.35 |
| 5,904,154 | 5/1999 | Chien et al. | 134/1.2 |
| 5,939,763 | 8/1999 | Hao et al. | 257/411 |
| 6,025,263 | 2/2000 | Tsai et al. | 438/624 |

(List continued on next page.)

FOREIGN PATENT DOCUMENTS 12-267128    9/2000  (JP) .

OTHER PUBLICATIONS

Talevi, R., et al., "Material and Process Studies in the Integration of Plasma–Promoted Chemical–Vapor Deposition of Aluminum with Benzocyclobutene Low–Dielectric Constant Polymer", *Journal of Vacuum Science & Technology B*, vol. 18, No. 1, Jan.–Feb., 2000, pp. 252–261.

(List continued on next page.)

Primary Examiner—Kevin M. Picardat
Assistant Examiner—D. M. Collins

(57) ABSTRACT

A process is provided for removing resist mask material from a protective barrier layer formed over a layer of low k silicon oxide dielectric material of an integrated circuit structure without damaging the low k dielectric material, and without the necessity of subjecting the exposed via sidewalls of the low k dielectric material to either a pretreatment to inhibit subsequent damage to the low k dielectric material during the resist removal, or a post treatment to repair damage to the low k material after the resist removal. The resist removal process comprises exposing the resist mask material to a hydrogen plasma formed from a source of hydrogen such as ammonia, while maintaining the temperature below about 40° C. to inhibit attack of the low k silicon oxide dielectric material by oxygen released from the decomposition of the resist material.

20 Claims, 2 Drawing Sheets

U.S. PATENT DOCUMENTS

| | | | |
|---|---|---|---|
| 6,028,015 | * 2/2000 | Wang et al. | |
| 6,037,248 | 3/2000 | Ahn | 438/619 |
| 6,051,073 | 4/2000 | Chu et al. | 118/723 |
| 6,051,477 | 4/2000 | Nam | 438/404 |
| 6,066,574 | 5/2000 | You et al. | 438/781 |
| 6,114,259 | 9/2000 | Sukharev et al. | 438/789 |
| 6,147,012 | 11/2000 | Sukharev et al. | 438/787 |
| 6,153,524 | 11/2000 | Henley et al. | 438/691 |
| 6,204,192 | 3/2001 | Zhao et al. | 438/723 |
| 6,232,658 | 5/2001 | Catabay et al. | 257/701 |

OTHER PUBLICATIONS

Bothra, S., et al., "Integration of 0.25 µm Three and Five Level Interconnect System for High Performance ASIC", *1997 Proceedings Fourteenth International VMIC Conference*, Santa Clara, CA, Jun. 10–12, 1997, pp. 43–48.

Dobson, C.D., et al., "Advanced $SiO_2$ Planarization Using Silane and $H_2O_2$", *Semiconductor International*, Dec. 1994, pp. 85–88.

McClatchie, S., et al., "Low Dielectric Constant Oxide Films Deposited Using CVD Techniques", *1998 Proceedings Fourth International DUMIC Conference*, Feb. 16–17, 1998, pp. 311–318.

Peters, Laura, "Pursuing the Perfect Low–k Dielectric", *Semiconductor International*, vol. 21, No. 10, Sep., 1998, pp. 64–66, 68, 70, 72, and 74.

Wall, R. et al., "An Effective Residual Photoresist Strip in a Reducing Ambient–Application to CVD W with Non–Etchback Siloxane SOG", *Conference Proceedings ULSI XI*, Materials Research Society Publications, 1996, pp. 169–174.

Wang, C.Y, et al., "The Effect of Ion–Implantation and E–Beam Cure on the Properties of Methyl Silsesquioxane Films", *Proceedings from DUMIC Conference*, Feb. 8–9, 1999, pp. 305–312.

Koda, Seiichiro, et al., "A Study of Inhibition Effects for Silane Combustion by Additive Gases", *Combustion and Flame*, vol. 73, No. 2, Aug., 1988, pp. 187–194.

* cited by examiner

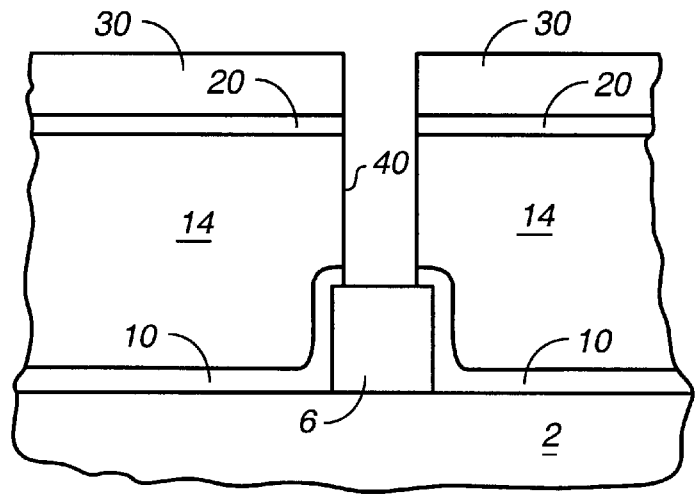
FIG._1
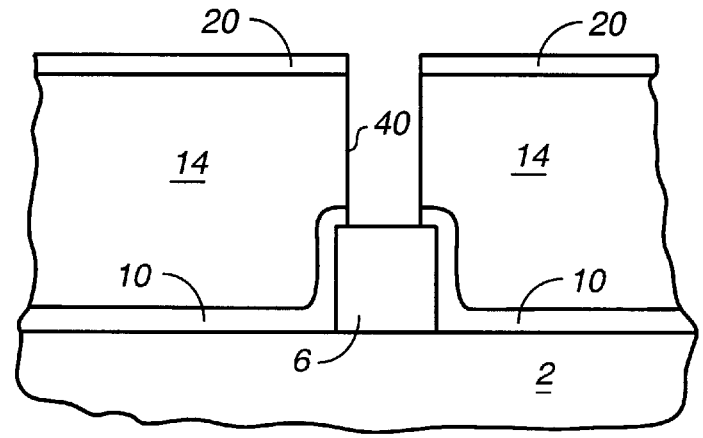
FIG._2
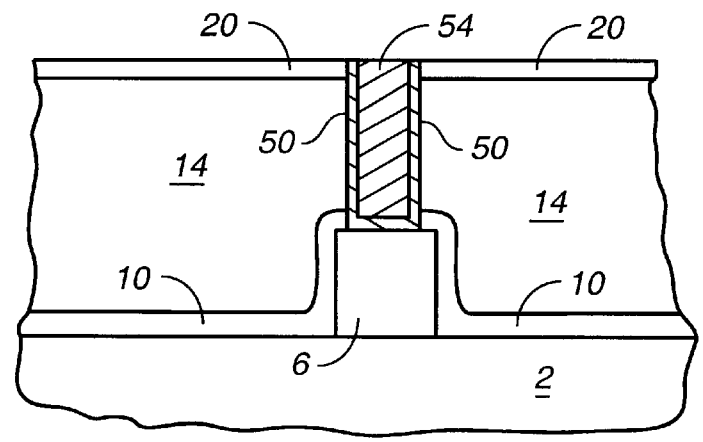
FIG._3

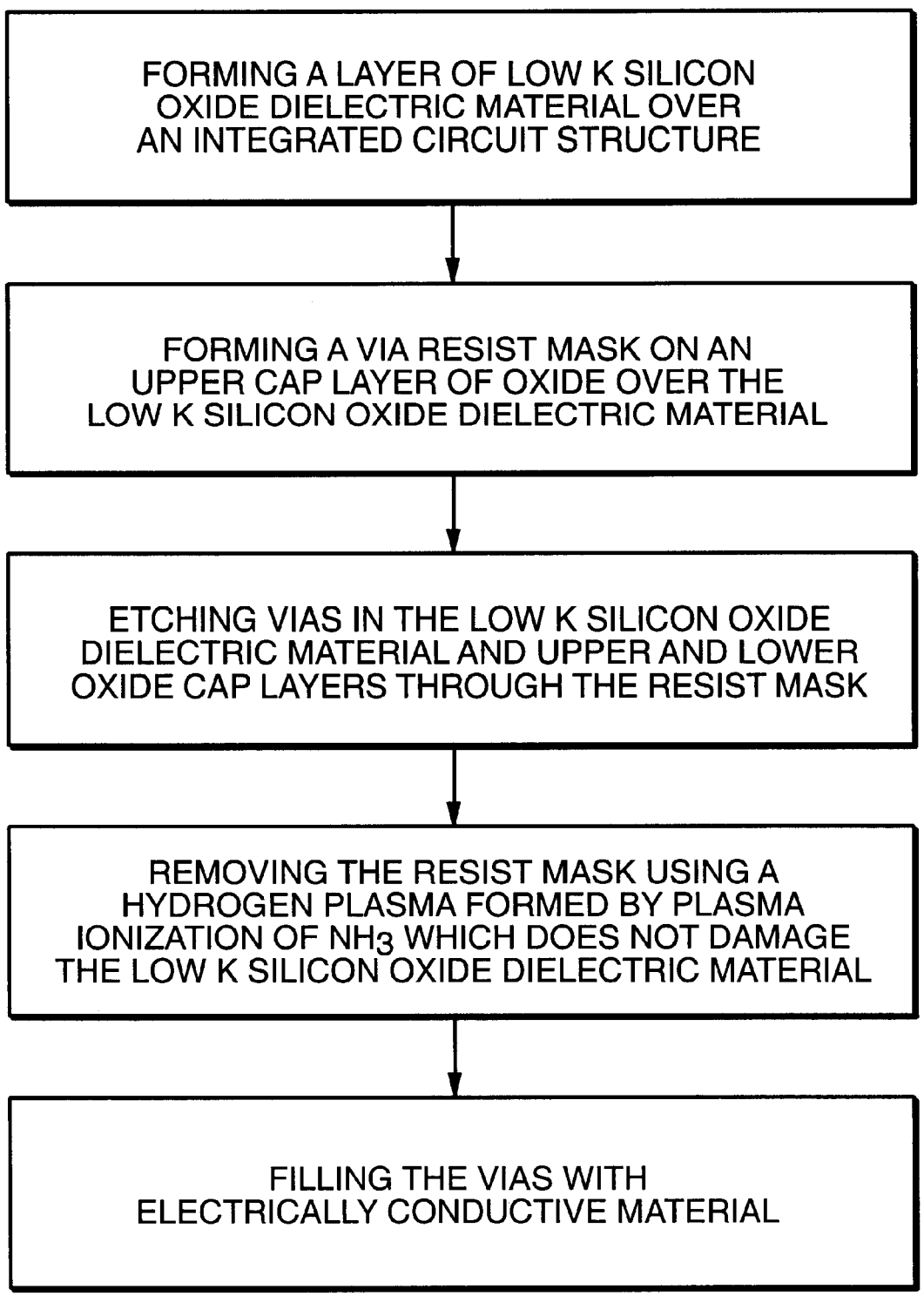
FIG._4

PROCESS FOR REMOVING RESIST MASK OF INTEGRATED CIRCUIT STRUCTURE WHICH MITIGATES DAMAGE TO UNDERLYING LOW DIELECTRIC CONSTANT SILICON OXIDE DIELECTRIC LAYER

BACKGROUND OF THE INVENTION

1. Field of the Invention

This invention relates to a process for making integrated circuit structures. More particularly, this invention relates to a process for removing a resist mask formed over a low dielectric constant silicon oxide dielectric layer without damaging the low dielectric constant silicon oxide dielectric material.

2. Description of the Related Art

In the continuing reduction of scale in integrated circuit structures, both the width of metal interconnects or lines and the horizontal spacing between such metal lines on any particular level of such interconnects have become smaller and smaller. As a result, horizontal capacitance has increased between such conductive elements. This increase in capacitance, together with the vertical capacitance which exists between metal lines on different layers, results in loss of speed and increased cross-talk. As a result, reduction of such capacitance, particularly horizontal capacitance, has received much attention. One proposed approach to solving this problem of high capacitance is to replace the conventional silicon oxide ($SiO_2$) dielectric material, having a dielectric constant (k) of about 4.0, with another dielectric material having a lower dielectric constant to thereby lower the capacitance.

In an article by L. Peters, entitled "Pursuing the Perfect Low-K Dielectric", published in Semiconductor International, Volume 21, No. 10, September 1998, at pages 64–74, a number of such alternate dielectric materials are disclosed and discussed. Included in these dielectric materials is a description of a low k dielectric material having a dielectric constant of about 3.0 formed using a chemical vapor deposition (CVD) process developed by Trikon Technologies of Newport, Gwent, U.K. The Trikon process is said to react methyl silane ($CH_3$—$SiH_3$) with hydrogen peroxide ($H_2O_2$) to form monosilicic acid which condenses on a cool wafer and is converted into an amorphous methyl-doped silicon oxide which is annealed at 400° C. to remove moisture.

While the use of the above-described low k silicon oxide dielectric material as a substitute for standard k silicon oxide material results in the desired reduction of capacitance in the resulting integrated circuit structure, such low k silicon oxide dielectric material is more sensitive to other materials and processing than is standard k silicon oxide dielectric material. Because of this, it has been found to be necessary to provide thin barrier layers of conventional (standard k) silicon oxide dielectric material below and above the layer of low k silicon oxide dielectric material. While such barrier layers adequately protect the bottom and top surfaces of the layer of low k silicon oxide dielectric material, subsequent formation of vias, or contact openings, through such low k dielectric material to the underlying conductive portions such as metal lines, or contacts on an active device, exposes further surfaces of the low k silicon oxide dielectric material, i.e., the sidewall surfaces of the vias or contact openings formed through the low k silicon oxide dielectric material.

Exposure of such sidewall surfaces of the via cut through the low k silicon oxide dielectric material can contribute to a phenomena known as via poisoning wherein filler material subsequently deposited in the via, such as a titanium nitride liner and tungsten filler material, fails to adhere to the via surfaces. Apparently the presence of carbon or other materials in the low k silicon oxide dielectric material renders the material more susceptible to damage during subsequent processing of the structure. For example, contact openings or vias are usually etched in the low k dielectric layer through a resist mask, following which the resist mask is removed.

Conventionally such via resist mask removal is carried out using an $O_2$ ashing process which is fast, inexpensive, and easy to handle. However, when such an $O_2$ ashing process is used to remove a via resist mask used to form vias in low k silicon oxide dielectric material, the oxygen apparently attacks the silicon bonds in the low k dielectric material, e.g., Si—C and Si—H bonds. Thus, when the via resist mask is removed by a conventional ashing process using $O_2$, damage can occur to the newly formed and exposed via surfaces of the low k dielectric material resulting in the aforementioned via poisoning, necessitating at least a reduction in the temperature of the ashing process (normally~100° C.). However, even so called mild ashing or oxidizing at about 10° C. is still not completely satisfactory, due to temperature rises in the substrate or wafer as a result of the oxidation which takes place during the process, even when the process temperature is initially low.

U.S. Pat. No. 6,028,015 was issued on Feb. 22, 2000 from copending U.S. patent application Ser. No. 09/281,514 entitled "PROCESS FOR TREATING DAMAGED SURFACES OF LOW DIELECTRIC CONSTANT ORGANO SILICON OXIDE INSULATION MATERIAL TO INHIBIT MOISTURE ABSORPTION", filed Mar. 29, 1999 and assigned to the assignee of this application. The subject matter of U.S. Pat. No. 6,028,015 is hereby incorporated by reference. In that patent it is proposed to treat such damaged via sidewalls of low k silicon oxide dielectric material, after the via resist mask removal, with either a hydrogen plasma or a nitrogen plasma. Such a treatment with a hydrogen or nitrogen plasma causes the hydrogen or nitrogen to bond to silicon atoms with dangling bonds left in the damaged surface of the low dielectric constant organo silicon oxide insulation layer to replace organo material severed from such silicon stoms at the damaged surface.

U.S. Pat. No. 6,114,259 was issued on Sep. 5, 2000 from copending U.S. patent application Ser. No. 09/362,645 entitled "PROCESS FOR TREATING EXPOSED SURFACES OF A LOW DIELECTRIC CONSTANT CARBON DOPED SILICON OXIDE DIELECTRIC MATERIAL TO PROTECT THE MATERIAL FROM DAMAGE", filed Jul. 27, 1999 and assigned to the assignee of this application. The subject matter of U.S. Pat. No. 6,114,259 is hereby incorporated by reference. In that patent, it is proposed to prevent degradation of the exposed surfaces of a low k carbon doped silicon oxide dielectric material during removal of an etch mask after formation of vias or contact openings in the low k carbon doped silicon oxide dielectric material by a two step process. First, prior to resist mask removal, the exposed surfaces of a low k carbon doped silicon oxide dielectric material are treated with a plasma capable of forming a densified layer on and adjacent the exposed surfaces of low k carbon doped silicon oxide dielectric material. Then the semiconductor wafer is treated with a mild oxidizing agent capable of removing photoresist materials from the semiconductor wafer.

It would, however, be desirable to provide a process for removing a via resist mask from a barrier layer formed over a layer of low k silicon oxide dielectric material of an integrated circuit structure without damaging the low k dielectric material, and without the necessity of subjecting the exposed via sidewalls of the low k dielectric material to either a pretreatment to inhibit subsequent damage to the low k dielectric material during the resist removal, or a post treatment to repair damage to the low k dielectric material after the resist removal.

SUMMARY OF THE INVENTION

In accordance with the invention, a process is provided for removing resist mask material from a barrier layer formed over a layer of low k silicon oxide dielectric material of an integrated circuit structure without damaging the low k dielectric material, and without the necessity of subjecting the exposed via sidewalls of the low k dielectric material to either a pretreatment to inhibit subsequent damage to the low k dielectric material during the resist removal, or a post treatment to repair damage to the low k dielectric material after the resist removal. The resist removal process comprises exposing the resist mask material to a hydrogen plasma formed from a source of hydrogen such as ammonia, while controlling the temperature to inhibit attack of the low k silicon oxide dielectric material by oxygen released from the decomposition of the resist material.

BRIEF DESCRIPTION OF THE DRAWINGS

FIG. 1 is a fragmentary vertical cross-sectional view of an integrated circuit structure showing a via formed in a low k silicon oxide dielectric layer using a resist mask.

FIG. 2 is a fragmentary vertical cross-sectional view of the structure of FIG. 1 after removal of the resist mask using the process of the invention.

FIG. 3 is a fragmentary vertical cross-sectional view of the structure of FIG. 2 after filling the via with conductive material.

FIG. 4 is a flowsheet further illustrating the process of the invention.

DETAILED DESCRIPTION OF THE INVENTION

The invention comprises a process for removing resist mask material from a barrier layer formed over a layer of low k silicon oxide dielectric material of an integrated circuit structure without damaging the low k dielectric material, and without the necessity of subjecting the exposed via sidewalls of the low k dielectric material to either a pretreatment to inhibit subsequent damage to the low k dielectric material during the resist removal, or a post treatment to repair damage to the low k material after the resist removal. The resist removal process comprises exposing the resist mask material to a hydrogen plasma formed from a source of hydrogen such as ammonia, while controlling the temperature to inhibit attack of the low k silicon oxide dielectric material by oxygen released from the decomposition of the resist material.

The term "low k", as used herein is intended to define a dielectric constant of 3.5 or less, preferably 3.0 or less, while the term "standard k", as used herein is intended to define a dielectric constant of over 3.5, typically about 4.0.

In FIG. 1, an integrated circuit structure 2 is shown which includes an upper insulation layer on which conductive portions such as illustrated metal line 6 are formed. A thin protective capping layer 10 of standard k silicon oxide is formed over integrated circuit structure 2 and metal line 6 and a layer 14 of low k silicon oxide dielectric material is formed over lower cap layer 20. A second thin standard k silicon oxide capping layer 20 is then formed over low k silicon oxide dielectric layer 14.

The low k silicon oxide dielectric material may, for example, be formed by reacting with hydrogen peroxide either a carbon-substituted silane such as described in the previously cited Peters article, or a carbon-substituted silane such as described in copending Aronowitz et al. U.S. patent application Ser. No. 09/274,457 entitled "LOW DIELECTRIC CONSTANT MULTIPLE CARBON-CONTAINING SILICON OXIDE DIELECTRIC MATERIAL FOR USE IN INTEGRATED CIRCUIT STRUCTURES, AND METHOD OF MAKING SAME", filed Mar. 22, 1999 and assigned to the assignee of this invention, the subject matter of which is hereby incorporated by reference.

Over upper silicon oxide capping layer 20 is formed a via resist mask 30 which may vary in thickness from about 1,000 Å to about 10,000 Å (from about 100 nm to about 1,000 nm). Via resist mask 30 has one or more via mask openings formed therein such as opening 32 through which a via 40 has been previously etched down through capping layers 10 and 20 and layer 14 of low k silicon oxide dielectric material to the top of metal line 6 on integrated circuit structure 2.

Resist mask 30 must now be removed without damaging the exposed low k silicon oxide dielectric material in the sidewalls of via 40 to thereby mitigate the effects of via poisoning wherein subsequent filling of the via with electrically conductive material after the resist removal is inhibited. As previously discussed above, conventional removal of resist mask 30 would involve exposure of the structure to an ashing process using $O_2$. However, it has been determined that materials such as carbon or fluorine, added to silicon oxide to lower the dielectric constant of the oxide, apparently cause the $O_2$ in the conventional ashing process to attack the low k silicon oxide dielectric material.

In accordance with the invention, resist mask 30 is removed from the structure by exposing the resist mask to a hydrogen plasma for a period of time which may range from about 1 minute to about 6 minutes, depending upon the thickness of the resist mask and other process parameters. The hydrogen source for the plasma may comprise any gaseous source of hydrogen which will not attack the low k silicon oxide dielectric material, including forming gas which comprise several percent $H_2$ in an $N_2$ carrier gas. A preferred source of hydrogen for the hydrogen plasma, however, is $NH_3$. A very high concentration of H-radicals can be obtained by plasma ionization of $NH_3$ which, in turn, will break down the cross-linked bonds in the photo resist mask by either chemical reaction using, for example, a downstream microwave reactor, or by reactive ion etching in an RIE or non-downstream plasma asher.

The hydrogen plasma removal of resist mask 30 may be carried out in various types of commercially available plasma etching apparatus capable of forming hydrogen plasmas such as, for example, RIE etchers available from LAM or TCP, RIE/microwave etchers by Mattson or Gasonics, RIE/microwave ashers by ULVAC, or magnetically coupled plasma etchers available from TEL, etc. The reactor pressure may range from as little as 10 millitorr up to as high as 1–2 torr, depending upon the type of apparatus used and other parameters. The plasma power may range from about 100 watts up to about 2000 watts, preferably from about 100 watts up to about 1000 watts, again depending upon the equipment and other reaction parameters. The flow rate of the hydrogen-containing gas such as $NH_3$ into the plasma chamber will be equivalent to a range of from about 50 standard cubic centimeters per minute (sccm) to about 2000 sccm for a 30 liter chamber, preferably from about 100 sccm to about 1000 sccm, and typically about 200 sccm for that size chamber. The time for the resist mask removal reaction will vary with the thickness of the resist mask, but should range from about 0.5 to about 1.5 minutes per 2000 Å (200 nm) of resist mask thickness. Typically, the resist mask removal rate will be about 2,000 Å per minute.

While the hydrogen plasma will not significantly damage the low k silicon oxide dielectric material at temperatures as high as 300° C., the decomposition of the resist mask material by the hydrogen plasma results in release of oxygen which can attack the low k silicon oxide dielectric material at such temperatures. Therefore, the temperature of the low k silicon oxide dielectric material during the resist removal reaction must be maintained sufficiently low to inhibit any attack of the low k silicon oxide dielectric material by the released oxygen. The temperature of the low k silicon oxide dielectric material during the reaction is, therefore, kept below about 40° C. Preferably, the temperature of the low k silicon oxide dielectric material during the reaction will be maintained within a range of from about 0° C. to about 30° C., and most preferably within a temperature range of from about 15° C. to about 25° C., with a typical temperature comprising about 20° C.

After removal of via resist mask 40 by the process of the invention, via 40 may be successfully filled with electrically conductive material without encountering via poisoning from the resist removal. As shown in FIG. 3, such filling of via 40 with electrically conductive material may comprise depositing a thin liner 50 of titanium/titanium nitride on the via walls (and bottom of the via) followed by filling of the remainder of the via with tungsten 54.

To further illustrate the invention, four 8 inch silicon wafers were each formed with a 100 Å lower cap layer of standard k silicon oxide. A 3000 Å thick layer of low k silicon oxide dielectric material was then formed on two of the wafers by reaction between methyl silane and hydrogen peroxide. A 6000 Å thick layer of low k silicon oxide dielectric material was formed on the other two wafers by the same method. A 6000 Å upper cap layer of standard k silicon oxide dielectric material was then formed over the low k dielectric layer on all four wafers. In each case an identical 6000–7000 Å via resist mask was then formed over the structure and the same pattern of vias was formed in the low k dielectric layers and the cap layers of all four wafers through the resist mask. After formation of the vias, the resist masks were removed from all of the wafers. The resist masks were then removed on one of the wafers with a 3000 Å coating of low k dielectric material and on one of the wafers with a 6000 Å coating of low k dielectric material using the hydrogen plasma process of the invention, while the resist masks on the other two wafers were removed using the conventional $O_2$ ashing process of the prior art, as follows:

In accordance with the invention, one of the wafers having the 3000 Å coating of low k dielectric material was then placed in a 30 liter ULVAC RIE/microwave plasma asher maintained at a pressure of about 300 millitorr. 400 sccm of $NH_3$ and 100 sccm of $N_2$ were flowed into the reactor and a plasma was ignited in the reactor and maintained at a power level of 300–500 watts. The temperature of the wafer in the asher was maintained at about 20° C. during the plasma ash which was carried out for a period of about 3 minutes, after which the plasma was extinguished.

The wafer was then removed from the asher and examined to determine that all of the resist mask had been removed. This hydrogen ashing process of the invention was then repeated for one of the wafers having the 6000 Å coating of low k dielectric material.

As controls, the resist masks on the other two wafers were each removed by conventional oxygen ashing. One of the control wafers was placed in a 30 liter MATRIX microwave plasma asher maintained at a pressure of about 1300 millitorr. 4000 sccm of $O_2$ and 400 sccm of $N_2$ were then flowed into the reactor and a plasma was ignited and maintained in the reactor at about 100 watts for a period of about 35 seconds while the wafer was maintained at a temperature of about 225° C., after which the plasma was extinguished. The control wafer was then removed from the asher and the other control wafer was then subject to the same treatment. Each of the two control wafers was then respectively examined to determine removal of all the resist mask.

The vias on all four wafers were then identically filled by first depositing a liner comprising 100 Å of titanium and 350 Å of titanium nitride on the via walls and then filling the remainder of each via with tungsten. The four wafers were then examined to determine the extent of the via filling on each wafer. About 90% of the vias on the control wafers were filled, while about 99.9% of the vias on the wafers processed in accordance with the invention were filled, indicating the superiority of the hydrogen plasma process of the invention for removing via resist masks without damaging the low k silicon oxide dielectric material comprising the via sidewalls.

Thus the removal of a via resist mask, after formation of vias in a layer of low k silicon oxide dielectric material, can be carried out, while avoiding or mitigating damage to the exposed low k silicon oxide dielectric material comprising the sidewalls of the vias, in accordance with the practice of the invention, using a hydrogen plasma. As a result, via poisoning, wherein many of the vias fail to properly fill with metal due to damage to the exposed low k silicon oxide dielectric material sidewalls of the vias, is avoided when the process of the invention is carried out to remove the via resist mask with a hydrogen plasma instead of the conventional oxygen plasma or ashing process.

Having thus described the invention what is claimed is:

1. A process for removing a via resist mask from an integrated circuit structure which includes a layer of low k silicon oxide dielectric material having vias previously formed therein through openings in said via resist mask which comprises exposing said via resist mask to a hydrogen plasma formed by flowing $NH_3$ into a resist removal chamber and igniting a hydrogen plasma in said chamber while said integrated circuit structure is maintained at a temperature below about 40° C. to remove said resist mask without damage to said low k dielectric material exposed by said vias previously formed therein.

2. The process of claim 1 wherein said process is carried out while said integrated circuit structure is maintained at a temperature ranging from about 0° C. to about 30° C.

3. The process of claim 1 wherein said process is carried out while said integrated circuit structure is maintained at a temperature ranging from about 15° C. to about 25° C.

4. The process of claim 1 wherein said process is carried out while said integrated circuit structure is maintained at a temperature of about 20° C.

5. A process for removing a via resist mask from an integrated circuit structure on a semiconductor substrate which includes a low k silicon oxide dielectric layer having vias previously formed therein through openings in said via resist mask which comprises:

a) forming a hydrogen plasma from a source of $NH_3$;

b) exposing said via resist mask to said hydrogen plasma for a time period sufficient to remove said via resist mask from said integrated circuit structure without, however, damaging the exposed low k silicon oxide dielectric material comprising sidewalls of said vias; and c) maintaining said substrate at a temperature below about 40° C. during said via resist mask removal;

whereby poisoning of said vias in said low k silicon oxide dielectric material is mitigated.

6. The process of claim 5 wherein said process is carried out while said substrate is maintained at a temperature ranging from about 0° C. to about 30° C.

7. The process of claim 5 wherein said process is carried out while said substrate is maintained at a temperature ranging from about 15° C. to about 25° C.

8. The process of claim 5 wherein said process is carried out while said substrate is maintained at a temperature of about 20° C.

9. The process of claim 5 wherein said process is carried out while maintaining said plasma at a power level of from about 100 watts to about 2000 watts.

10. The process of claim 5 wherein said process is carried out while maintaining said substrate at a pressure of from about 10 millitorr to about 2 torr.

11. The process of claim 5 wherein said process is carried out for a period of from about 0.5 to about 1.5 minutes per 2000 Å of resist thickness.

12. A process for removing a via resist mask from an integrated circuit structure on a semiconductor substrate which includes a low k silicon oxide dielectric layer having vias previously formed therein through openings in said via resist mask which comprises:

a) introducing said semiconductor substrate into a resist removal chamber;

b) flowing $NH_3$ into said resist removal chamber;

c) igniting a hydrogen plasma in said chamber;

d) exposing said via resist mask to said hydrogen plasma for a time period of from about 0.5 minutes to about 1.5 minutes per 2000 Å thickness of said via resist mask; and e) maintaining said substrate at a temperature of from about 0° C. to about 30° C. during said via resist mask removal;

whereby damage to the exposed low k silicon oxide dielectric material comprising the sidewalls of said vias and resultant poisoning of said vias is mitigated.

13. The process of claim 12 wherein said $NH_3$ is flowed into said chamber at a rate equivalent to flowing from about 50 sccm to about 2000 sccm into a 30 liter chamber.

14. The process of claim 12 wherein said $NH_3$ is flowed into said chamber at a rate equivalent to flowing from about 100 sccm to about 1000 sccm into a 30 liter chamber.

15. The process of claim 12 wherein said hydrogen plasma is maintained at a power level of from about 100 watts to about 2000 watts during said process.

16. The process of claim 12 wherein said hydrogen plasma is maintained at a power level of from about 100 watts up to about 1000 watts during said process.

17. The process of claim 12 wherein said process is carried out while said substrate is maintained at a temperature ranging from about 15° C. to about 25° C.

18. The process of claim 12 wherein said process is carried out while said substrate is maintained at a temperature of about 20° C.

19. The process of claim 12 wherein said process is carried out while maintaining said substrate at a pressure of from about 10 millitorr to about 2 torr.

20. A process for removing a via resist mask from an integrated circuit structure on a semiconductor substrate which includes a low k silicon oxide dielectric layer having vias previously formed therein through openings in said via resist mask which comprises:

a) forming a layer of low k silicon oxide dielectric material over an integrated circuit structure on a semiconductor substrate by reacting carbon-substituted silane with hydrogen peroxide;

b) forming vias in said layer of low k silicon oxide dielectric material through a via resist mask;

c) then forming a hydrogen plasma from a source of $NH_3$ in a resist removal chamber;

d) exposing said via resist mask to said hydrogen plasma in said chamber for a time period sufficient to remove said via resist mask from said integrated circuit structure without, however, damaging the exposed low k silicon oxide dielectric material comprising the sidewalls of said vias; and e) maintaining said low k silicon oxide dielectric material at a temperature below about 40° C. during said via resist mask removal;

whereby poisoning of said vias in said low k silicon oxide dielectric material is mitigated.

* * * * *